United States Patent
Park et al.

(10) Patent No.: US 8,410,484 B2
(45) Date of Patent: Apr. 2, 2013

(54) FLAT DISPLAY DEVICE WITH A DUMMY PIXEL INTEGRALLY FORMED IN A PERIPHERAL REGION

(75) Inventors: Sung Jin Park, Daegu (KR); Jea Gu Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/406,072

(22) Filed: Feb. 27, 2012

(65) Prior Publication Data

US 2012/0153290 A1    Jun. 21, 2012

Related U.S. Application Data

(62) Division of application No. 12/318,519, filed on Dec. 30, 2008, now Pat. No. 8,148,181.

(30) Foreign Application Priority Data

Feb. 19, 2008  (KR) .................. 10-2008-0014899

(51) Int. Cl.
  *H01L 29/04*  (2006.01)
  *H01L 31/036*  (2006.01)
  *H01L 31/0376*  (2006.01)
  *H01L 31/20*  (2006.01)
(52) U.S. Cl. ................. 257/59; 257/72; 349/46; 349/86
(58) Field of Classification Search .................. 257/59, 257/72; 349/46, 86
  See application file for complete search history.

(56) References Cited

U.S. PATENT DOCUMENTS

| | | | |
|---|---|---|---|
| 6,980,268 B2 | 12/2005 | You | |
| 7,064,734 B2 | 6/2006 | Kawamura et al. | |
| 7,067,983 B2 | 6/2006 | Ozawa et al. | |
| 7,098,986 B2 * | 8/2006 | Park et al. | 349/152 |
| 7,138,655 B2 * | 11/2006 | Tak et al. | 257/59 |
| 7,196,353 B2 * | 3/2007 | Murade | 257/59 |
| 7,728,329 B2 | 6/2010 | Joo et al. | |
| 2002/0145694 A1 | 10/2002 | Jang | |
| 2004/0126942 A1 | 7/2004 | Park et al. | |
| 2005/0007533 A1 * | 1/2005 | Tanaka et al. | 349/139 |
| 2007/0057260 A1 | 3/2007 | Lee | |

FOREIGN PATENT DOCUMENTS

| | | |
|---|---|---|
| JP | 2008-026348 | 2/2008 |
| TW | 200500702 | 1/2005 |
| TW | 200508722 | 3/2005 |
| TW | I291072 | 12/2007 |

* cited by examiner

*Primary Examiner* — Howard Weiss
(74) *Attorney, Agent, or Firm* — McKenna Long & Aldridge, LLP

(57) ABSTRACT

A flat display device is provided. The flat display device a substrate divided into an active region for displaying an image and a peripheral region that does not display the image, and includes: a gate line that crosses a data line to define a pixel region in the active region; a thin film transistor in a region near a crossing of the gate line and the data line; a first common electrode in the pixel region; a storage electrode on the first common electrode to provide storage capacitance; a pixel electrode electrically connected with the storage electrode and overlapping the pixel region, the data line, and the gate line; and an ink film covering the active region and the peripheral region, and having microcapsules including charged particles.

16 Claims, 9 Drawing Sheets

FLAT DISPLAY DEVICE WITH A DUMMY PIXEL INTEGRALLY FORMED IN A PERIPHERAL REGION

This application is a Divisional of application Ser. No. 12/318,519 filed Dec. 30, 2008, now U.S. Pat. No. 8,148,181, which claims priority to Korean Patent Application No. 10-2008-0014899, filed Feb. 19, 2008, all of which are incorporated by reference in their entirety for all purposes as if fully set forth herein.

BACKGROUND OF THE INVENTION

Field of the Invention

The present invention relates to a flat display device, and more particularly, to a flat display device having a structure for obtaining capacitance and increased reflectivity to improve image quality.

Generally, a flat display device converts data in electronic format and processed by an information processing apparatus into an image.

Examples of representative flat display devices include liquid crystal display (LCD) devices, organic electroluminescence display devices, plasma display panels (PDPs), and electrophoretic devices.

An LCD device displays an image using liquid crystals. An organic electroluminescence display device displays an image using an organic emission layer. A PDP device displays an image using plasma. An electrophoretic device displays an image using charged particles that reflect or absorb light.

A related art electrophoretic device includes a substrate, a pixel electrode, an ink layer, and a common electrode. The pixel electrode is disposed in a matrix configuration on the substrate, and the ink layer is attached as a film on the pixel electrode. The ink layer includes nano-sized charged particles. The charged particles include black charged particles or white charged particles. The common electrode is disposed on the ink layer.

However, for high resolution and large-sized electrophoretic devices, each pixel region may demand greater capacitance than is provided by the related art structure. Additionally, demand for higher screen quality for the electrophoretic devices has increased.

SUMMARY OF THE INVENTION

Accordingly, the present invention is directed to a flat display device and method for manufacturing the same that substantially obviates one or more of the problems due to limitations and disadvantages of the related art.

An advantage of the present invention is to provide a flat display device that extends a pixel electrode disposed in each pixel region of the flat display device such that the pixel electrode covers both a corresponding data line and a corresponding gate line disposed in each pixel region to secure capacitance in each pixel region, and improves reflectivity to improve image quality, and a method for manufacturing the flat display device.

Another advantage of the present invention is to provide a flat display device that can dispose an electrode even in a peripheral region of the flat display device to reduce a defect during an assembling process of the flat display device and a case, and a method for manufacturing the flat display device.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a flat display device includes: a substrate divided into an active region for displaying an image and a peripheral region that does not display the image; a gate line that crosses a data line to define a pixel region in the active region; a thin film transistor in a region near a crossing of the gate line and the data line;

a first common electrode in the pixel region; a storage electrode on the first common electrode to provide storage capacitance; a pixel electrode electrically connected with the storage electrode and overlapping the pixel region, the data line, and the gate line; and an ink film covering the active region and the peripheral region, and having microcapsules including charged particles In another aspect of the present invention, a method for manufacturing a flat display device includes: providing a substrate divided into an active region, a peripheral region, and a pad region; forming a metal layer on the substrate, and forming a gate electrode, a common electrode, a gate line, a common line, and a gate pad using a photolithography method including a mask; forming a gate insulating layer, an amorphous silicon layer, a doped amorphous silicon layer, and another metal layer on the substrate including the gate electrode, and forming a channel layer, source and drain electrodes, a storage electrode, a data line, and a data pad in a thin film transistor region using a photolithography method including one of a diffraction mask and a half-tone mask; forming a first passivation layer, a dielectric layer, and a second passivation layer on the substrate including the source and drain electrodes, and removing portions of the dielectric layer corresponding to the gate pad and the data pad while forming a contact hole in a storage electrode region; and forming a transparent conductive material on the substrate including the contact hole, and forming a pixel electrode, a gate pad electrode, and a data pad electrode using a photolithography method including a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts. In the description of embodiments, detailed descriptions of related known functions or constructions are omitted so that they may not obscure the subject matter of the embodiments.

In addition, in the following description, it will be understood that when a layer (or film), region, pattern, or structure is referred to as being on/above/over another layer (or film), region, pattern, or structure, it can be directly on the another layer (or film), region, pattern, or structure, or intervening layers (or film), regions, patterns, or structures may also be present. Further, it will be understood that when a layer (or film), region, pattern, or structure is referred to as being under/below another layer, it can be directly under/below the another layer (or film), region, pattern, or structure, and one or more intervening layers (or films), regions, patterns, or structures may also be present. Therefore, the meaning of on/above/over/under/below should be judged by the spirit of the present invention.

Figure 1A:
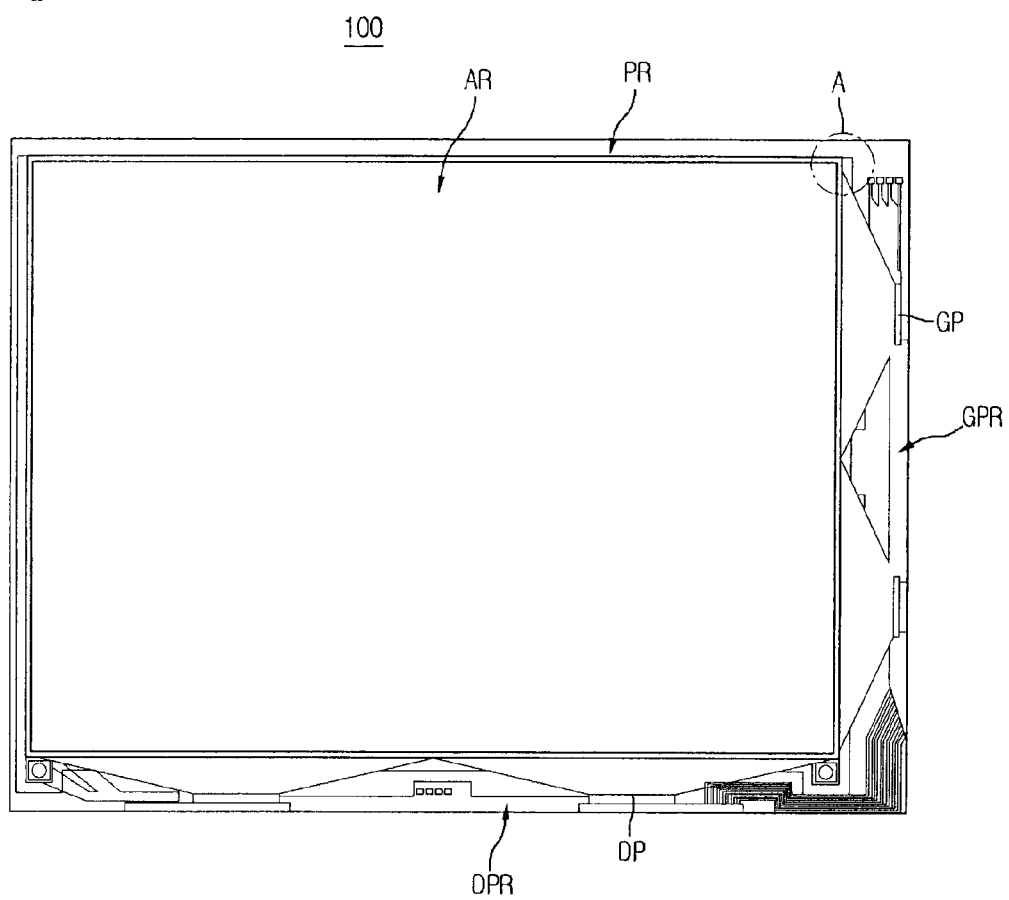
FIG. 1A is a plan view of a flat display device according to an embodiment of the invention.
Figure 1B:
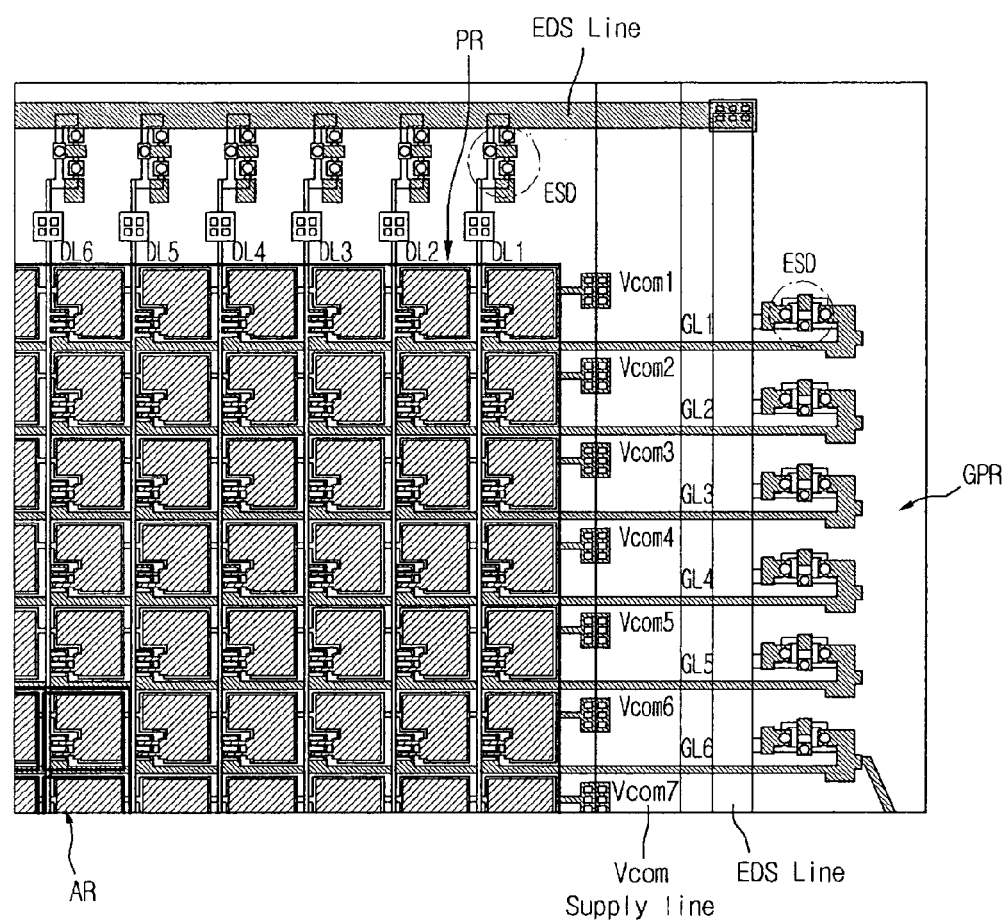
FIG. 1B is an enlarged view of the region A of FIG. 1A.

FIG. 1A is a plan view of a flat display device according to an embodiment of the invention, and FIG. 1B is an enlarged view of the region A of FIG. 1A.

Referring to FIGS. 1A and 1B, the flat display device 100 driven using an electrophoretic method that includes an active region AR, a peripheral region PR, a gate pad region GPR, and a data pad region DPR. A gate pad GP and a data pad DP are provided.

Referring to FIG. 1B, the active region AR and the peripheral region PR are each divided into a plurality of pixel regions. Each pixel region includes a common electrode, a storage electrode, and a pixel electrode. Data lines DL1, DL2, ..., and DLm, and gate lines GL1, GL2, ..., and GLn for driving the pixel regions extend into the outer block of the peripheral region PR. Electrostatic discharge (ESD) circuits are formed at the edge regions of the data lines DL1, DL2, ..., and DLm, and gate lines GL1, GL2, ..., and GLn, respectively. All of the ESD circuits are commonly connected to an ESD line. Common lines Vcom1, Vcom2, ..., Vcomn extend between the gate lines GL1, GL2, ..., and GLn, and are connected to a Vcom supply line in common.

The active region is a region in which data signals are supplied to respective pixel regions through the data lines DL1, DL2, ..., and DLm to display an image. Data signals are constantly supplied to the peripheral region PR through the data lines DL1, DL2, ..., and DLm for a predetermined time to realize predetermined brightness, for example, a brightness that can form most natural harmony with a case (not shown) that receives and protects the flat display device. For example, the predetermined brightness can be one of black, white, and gray brightness. When the peripheral region PR of the flat display device becomes exposed during an assembling process of the flat display device and the case, the peripheral region, which does not display the image desired by a user may be brought into view of the user's eyes. The peripheral region PR realizes predetermined brightness that is the same as or similar to that of the case to reduce a defect generated during an assembling process of the flat display device and the case. That is, since the peripheral region PR continuously realizes the predetermined brightness, the peripheral region PR can serve the function of an outer black matrix of a general liquid crystal display (LCD) device to reduce the visibility of an assembly defect of the case.

Figure 2:
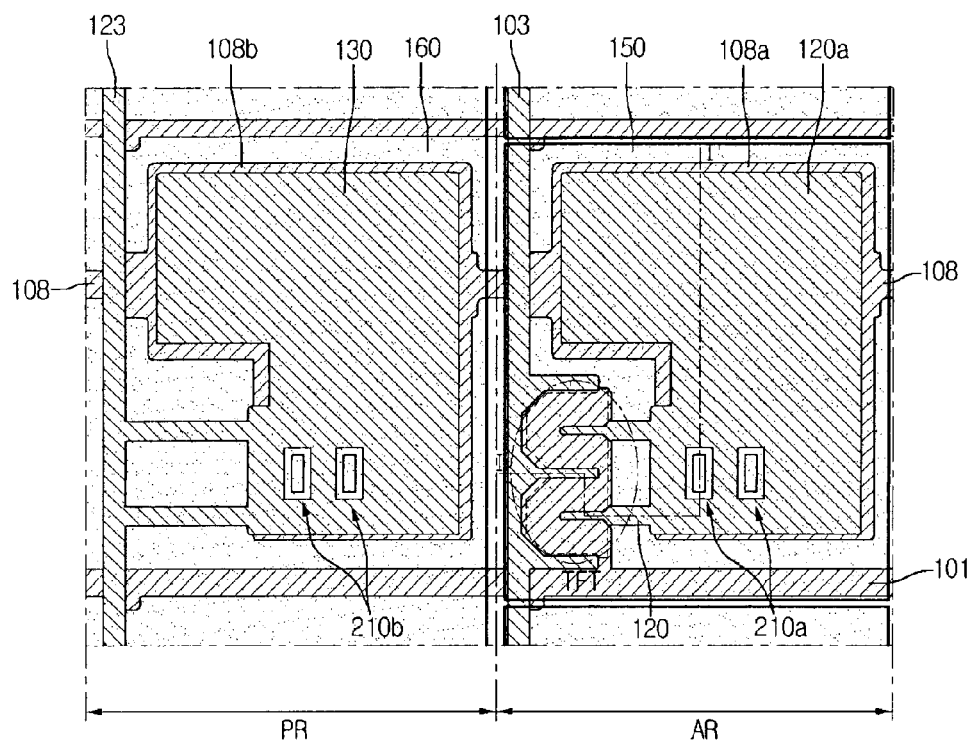
FIG. 2 is a plan view illustrating the pixel structures of the active region and the peripheral region of a flat display device according to an embodiment an embodiment of the invention.

In addition, as illustrated in the drawings, a pixel electrode is individually formed for each pixel region in the active region, but a dummy pixel electrode is integrally formed in the pixel regions in the peripheral region around the active region (refer to FIG. 2).

As illustrated in FIG. 1B, ESD circuits have been provided for the data lines DL1, DL2, ..., and DLm, and the gate lines GL1, GL2, ..., and GLn. However, ESD circuits have not been provided for the common lines Vcom1, Vcom2, ..., and Vcom. When the ESD circuits are connected in a closed loop through the Vcom supply line, voltage levels supplied to the common lines drop down or become distorted.

Accordingly, the ESD circuits are provided for the respective data lines DL1, DL2, ..., and DLm, and the gate lines GL1, GL2, ..., and GLn, and connected in a closed loop. However, the ESD circuits are not provided for the common lines Vcom1, Vcom2, ..., and Vcom, and are connected in a structure in which the Vcom supply line is open.

Figure 3:
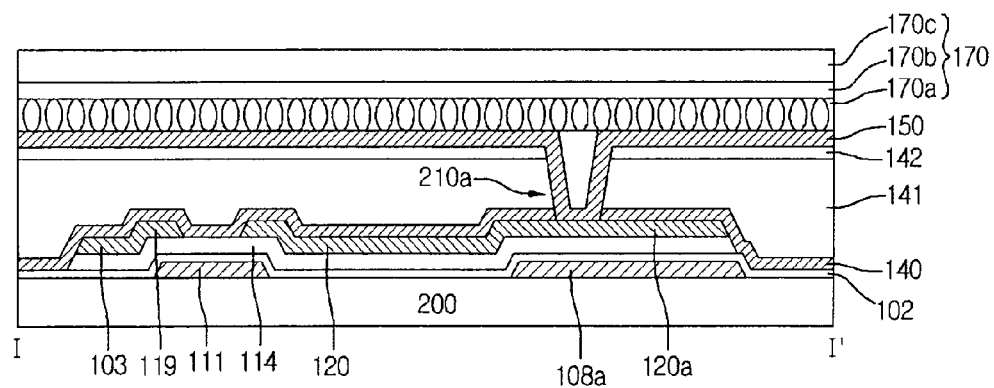
FIG. 3 is a cross-sectional view taken along the line I-I' of FIG. 2.

FIG. 2 is a plan view illustrating the pixel structures of the active region and the peripheral region of a flat display device according to an embodiment of the invention, and FIG. 3 is a cross-sectional view taken along the line I-I' of FIG. 2.

Referring to FIGS. 2 and 3, a plurality of pixel regions are defined in the active region AR. As illustrated in FIG. 2, a gate line 101 and a data line 103 are arranged to cross each other in each pixel region to define a unit pixel region. A thin film transistor (TFT), which is a switching device, is disposed in the region in which the gate line 101 and the data line 103 cross each other. A first common electrode 108a, storage electrodes 120a and pixel electrodes 150 extending from a drain electrode 120 of the TFT are disposed inside the pixel region such that they overlap one another. The first common electrode 108a branches off from a common line 108 substantially parallel to the gate line 101 to extend across the pixel region.

Figure 4A:
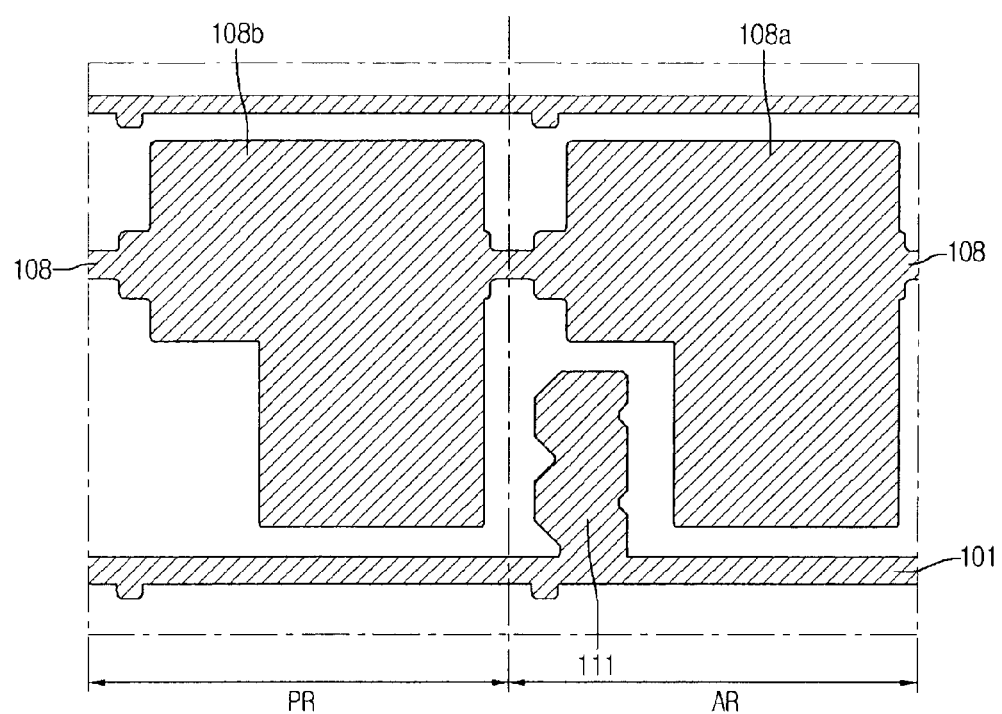
FIGS. 4A to 4D are views illustrating a method for manufacturing a flat display device according to another embodiment.

The common line 108 has a structure in which the width of the common line narrows in a region in which the common line crosses the data line 103. This narrowing is provided to prevent the data line 103 crossing the common line 108 from being cut. In addition, a predetermined gate line protrusion is formed in a region in which the gate line 101 crosses the data line 103 to prevent the data line 103 from being cut while the data line 103 is formed on the gate line 101. As illustrated in FIG. 4A, the predetermined protrusion extends from a lower portion of the gate line in a direction opposite of the direction that the gate electrode 111 extends from the gate line.

To allow the flat display device driven using the electrophoretic method to maintain an image frame constant over a long duration, a storage capacitance value of the pixel region should be large. Therefore, the first common electrode 108a and the storage electrode 120a extended in area to secure sufficient storage capacitance in the pixel region. That is, the storage electrode 120a and the first common electrode 108a are formed to occupy most of the pixel region.

In addition, since the flat display device driven using the electrophoretic method uses a high driving voltage compared to other flat display devices, a large TFT is provided. That is, for operation at a high driving voltage, a TFT having a wide channel width W and a long channel length L is provided (shown in a dotted line in a TFT region). In the flat display device driven using the electrophoretic method, when a pixel electrode is formed not to overlap a TFT as in a related art LCD device, reflectivity is reduced which may reduce image quality. However, in the case in which a pixel electrode is formed to overlap a TFT in a related art LCD device, liquid crystals of the LCD are abnormally driven by the voltages of the TFT's channel and the pixel electrode, which also reduces image quality. This abnormal driving issue is also present in the flat display devices driven using the electrophoretic method.

When a pixel electrode exists only inside a gate line and a data line as in a pixel region of a related art LCD device, the resulting reduced reflectivity lowers image quality in the flat display device driven using the electrophoretic method. However, when the pixel electrode is formed to cover the data line and the gate line of a pixel region, the size of parasitic capacitance Cgs and Cgd increases, so that a data signal is greatly distorted by the parasitic capacitance, which acts as a factor increasing a kick back voltage ΔV. When the kick back voltage increases, the image quality of the flat display device is reduced.

To address the problems described above, in an electrophoretic flat display device according to an embodiment of the invention, a pixel electrode extends up to and may overlap with one of a TFT, a gate line, and a data line, and a dielectric layer 141 is interposed between the pixel electrode and at least one of the TFT, the gate line, and the data line to minimize image quality reduction and simultaneously improve reflectivity.

In addition, the reflectivity in the pixel region is increased by extending the pixel electrode 150, and an image frame can be maintained for a long time by the increased size of the storage capacitance.

The gate line 101 and a dummy data line 123 crossing the gate line 101 define a dummy pixel region in the peripheral region. A dummy common electrode 108b, a dummy storage electrode 130 branching off from the dummy data line 123 and overlapping the dummy common electrode 108b, and a dummy pixel electrode 160 electrically connected with the dummy storage electrode 130, and covering the entire dummy pixel region in the peripheral region are disposed in each dummy pixel region. The dummy pixel electrode 160 extends along the peripheral region of FIG. 1 and is formed as a single electrode.

Figure 6:
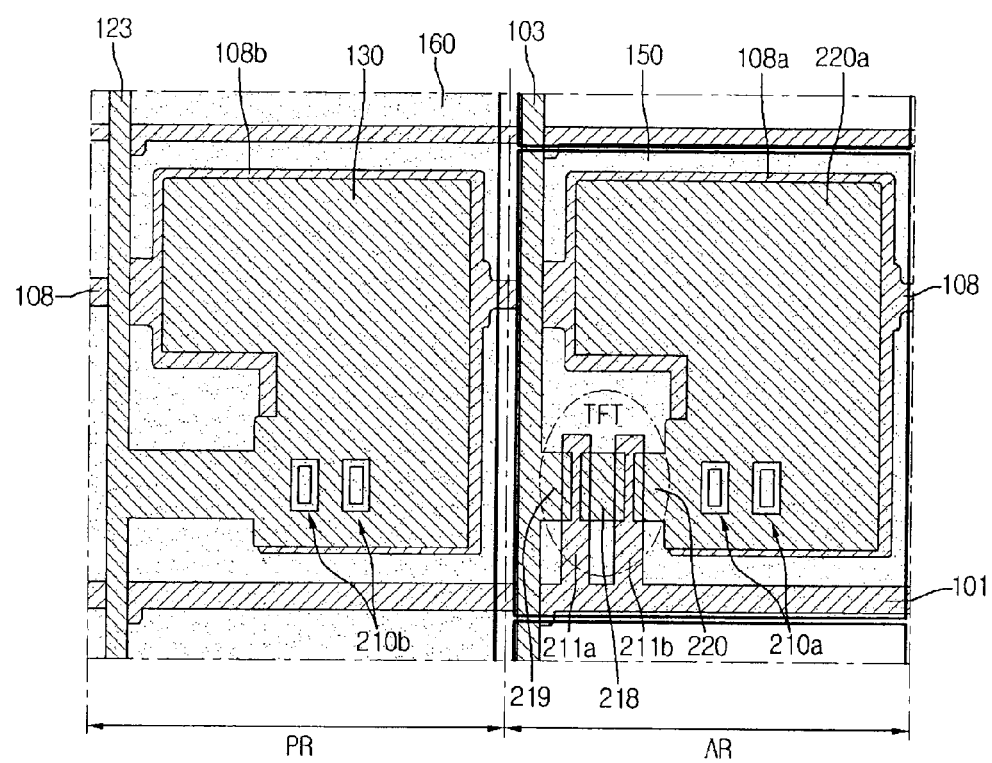
FIG. 6 is a plan view of a flat display device according to an embodiment of the invention.

Though the dummy storage electrode 130 is illustrated in FIG. 2 as formed in a structure branching off from the dummy data line 123 through two connection portions, the dummy storage electrode 130 is not limited to this construction, but can be connected to the data line 123 through one connection portion as in FIG. 6.

Referring to FIG. 3, when an image signal is supplied to a pixel region through the data line 103 in the active region AR, an electric field is formed between the pixel electrode 150 and a second common electrode 170b of an ink film 170. The electric field formed between the pixel electrode 150 and the second common electrode 170b moves charged particles contained in microcapsules of an ink layer 170a to realize a black or white image.

In addition, an image signal for realizing one of white, black, and gray colors is selectively supplied to the peripheral region PR through the dummy data line 123, so that an electric field applied to the ink layer 170a is formed between a dummy pixel electrode 160 and the second common electrode 170b of the ink film 170. Accordingly, one of white, black, and gray colors is realized on the peripheral region, so that the effect of a defect during an assembling process of the flat display device and the case can be reduced.

The dummy common electrode 108b branches off from the common line 108. First contact holes 210a shown are provided for electrically connecting the pixel electrode 150 with the storage electrode 120a. Second contact holes 210b are provided for electrically connecting the dummy pixel electrode 160 with the dummy storage electrode 130.

Although two first contact holes 210a and two second contact holes 210b are illustrated in the drawings, one, two, or more contact holes can be formed as the first contact holes 210a and the second contact holes 210b.

Additional detail is described with reference to FIGS. 2 and 3. The gate electrode 111 branching off from the gate line 101 into a pixel region, and the first common electrode 108a branching off from the common line 108 are formed on a substrate 200. A gate insulating layer 102 is formed on the substrate 200 on which the gate electrode 111 and the first common electrode 108a have been formed. A channel layer 114 of the TFT is formed on a portion of the gate insulating layer 102 corresponding to the gate electrode 111. The data line 103, a source electrode 119 branching off from the data line 103, and a drain electrode 120 facing the source electrode 119 are formed on the channel layer 114. The storage electrode 120a integrally formed with the drain electrode 120 and extending in the pixel region is formed on a portion of the gate insulating layer 102 corresponding to the first common electrode 108a to overlap the first common electrode 108a. The first common electrode 108a is provided for securing storage capacitance between the storage electrode 120a and the first common electrode 108a.

A first passivation layer 140 is formed on the substrate 200 on which the source and drain electrodes 119 and 120 have been formed. The dielectric layer 141 and a second passivation layer 142 are formed on the first passivation layer 140. The dielectric layer 141 may be an organic layer such as acryl, and can alternatively be an inorganic layer or a photoresist in a specific case. The pixel electrode 150 is formed on the second passivation layer 142, and connected to the storage electrode 120a formed in the lower portion through the first contact hole 210a. The dummy pixel electrode 160 in the peripheral region is electrically connected to the dummy storage electrode 130 through the second contact hole 210b.

The ink film 170 is provided on the pixel electrode 150. The ink film 170 includes the ink layer 170a contacting the pixel electrode 150, a protection film 170c protecting the ink layer 170a, and the second common electrode 170b interposed between the protection film 170c and the ink layer 170a. The ink layer 170a includes microcapsules including different kinds of charged particles, and the charged particles are driven using an electric field to reflect external light and realize a white state, or alternatively to absorb external light and realize a black state.

The dielectric layer 141 and the second passivation layer 142 are formed between the pixel electrode 150 and the first passivation layer 140 to minimize parasitic capacitance that may be generated between the pixels electrode 150, the gate lines 101, and the data lines 103. That is, the dielectric layer 141 controls a distance between the pixel electrode 150 and the storage electrode 120a, and has a dielectric constant to reduce parasitic capacitance.

In addition, the first passivation layer 140 prevents the electrodes of the TFT and the data lines 103 from directly contacting the dielectric layer 141 and being damaged. The second passivation layer 142 prevents the pixel electrode 150 from directly contacting the dielectric layer 141 and being damaged. In particular, in the case in which the dielectric layer 141 is an organic layer, a metal electrode directly contacting the dielectric layer 141 can be damaged due to an outgas generated from the organic layer. To prevent damage from the outgas, passivation layers may be formed on and under the dielectric layer 141, respectively.

Therefore, in a flat panel display according to the present invention, the pixel electrode 150 extends in the active region to increase reflectivity and thus improve image quality, and additionally secure storage capacitance in a unit pixel region.

The manufacturing method according to an embodiment of the invention will be described with reference to FIGS. 4A to 4D and FIG. 3.

Referring first to FIG. 4A, a gate line 101, a gate electrode 111, a common line 108, a first common electrode 108a, and a dummy common electrode 108b are formed on a substrate 200 divided into an active region AR and a peripheral region PR. Examples of a material that can be used for the gate line 101 and the common line 108 include Cu, Cr, a Cr alloy, Mo, and an alloy thereof. The lines and the electrodes are formed using a photolithography method including a mask and an etching process. In the illustrated embodiment, the common line 108 and the gate line 101 extend to the peripheral region as well as the active region.

The common line 108 narrows in line width in a region in which the data line and the common line cross as the common line 108 extends from a pixel region to an adjacent pixel region. This narrowing can prevent the data line from being cut by a height difference when the data line is formed with a gate insulating layer intervened.

In addition, a predetermined gate line protrusion is formed on the gate line 101 extending from the gate line 101 in a direction opposite to that of extension of the gate electrode 111 to prevent the data line from being cut by a height difference when the data line is formed afterward. The gate electrode 111 is formed to include predetermined grooves in a region in which a drain electrode and a source electrode cross the gate electrode 111 to prevent the electrodes from being cut by a height difference when the source electrode and the drain electrode are formed.

After the gate line 101 is formed on the substrate 200 as described above, the gate insulating layer 102 is formed on the entire region of the substrate 200. Examples of a material that can be used for the gate insulating layer 102 include $SiO_x$ and $SiN_x$.

Figure 4B:
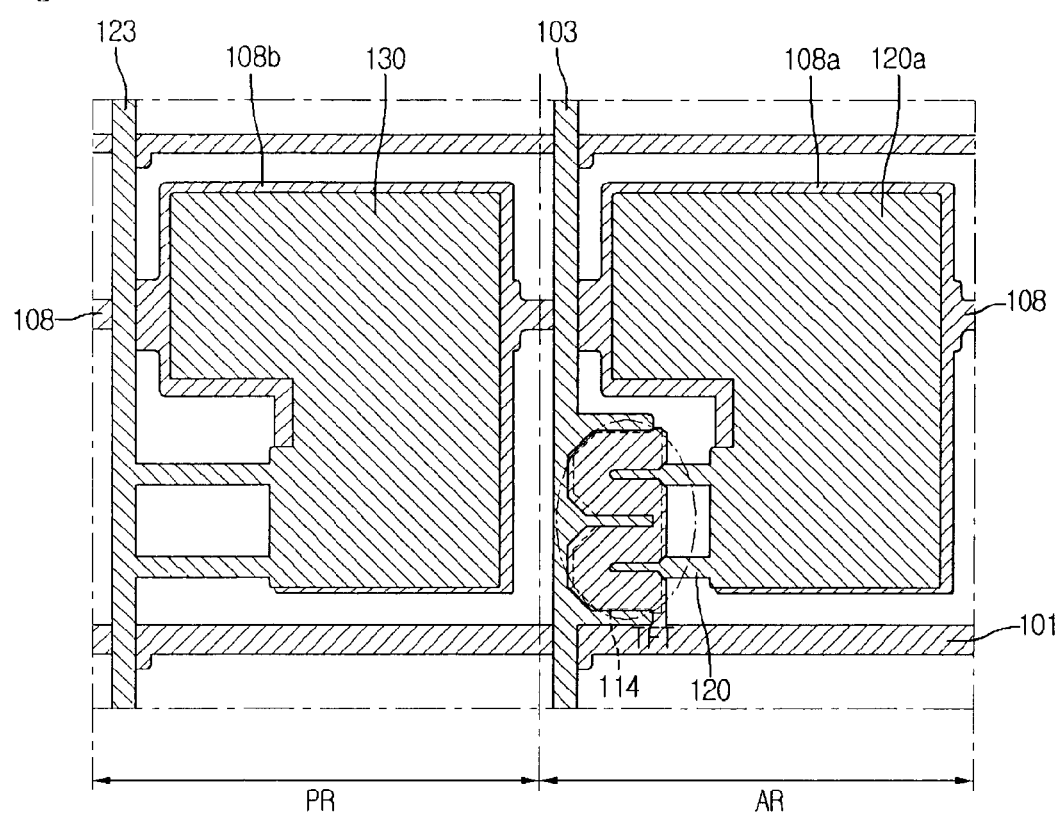

After the gate line 101 and the common line 108, and gate insulating layer 102 are formed on the substrate 200, a channel layer 114, source and drain electrodes 119 and 120, a storage electrode 120a, and a data line 103 are formed on the gate electrode 111 in the active region as illustrated in FIG. 4B. At this point, the channel layer 114, the source and drain electrodes 119 and 120, and the data line 103 may be simultaneously formed using a diffraction mask or a half-tone mask. Alternatively, a process using two masks may be used so that the channel layer 114 is formed followed by forming the source and drain electrodes 119 and 120 and the data line 103.

Next, a dummy data line 123 and a dummy storage electrode 130 branching off from the dummy data line 123 are simultaneously formed in the peripheral region.

The channel layer 114 can include an amorphous silicon layer and an n+ amorphous silicon layer doped with high concentration conductive impurities. In the illustrated embodiment of the present invention, the source electrode 119 is formed in a three-electrode structure, and the drain electrode 120 corresponding to the source electrode 119 is formed in a two-electrode structure to secure the desired width and length of the channel layer 114 of the TFT (shown by a dotted line in FIG. 4B). As a result, the source electrode 119 and the drain electrode 120 are formed in a double structure in which electrodes are engaged with each other as illustrated in FIG. 4B. The channel layer 114 shown by the dotted line is formed between the electrodes. The channel layer 114 can be remarkably greater in length and width than the channel layer of a related art TFT.

Figure 4C:
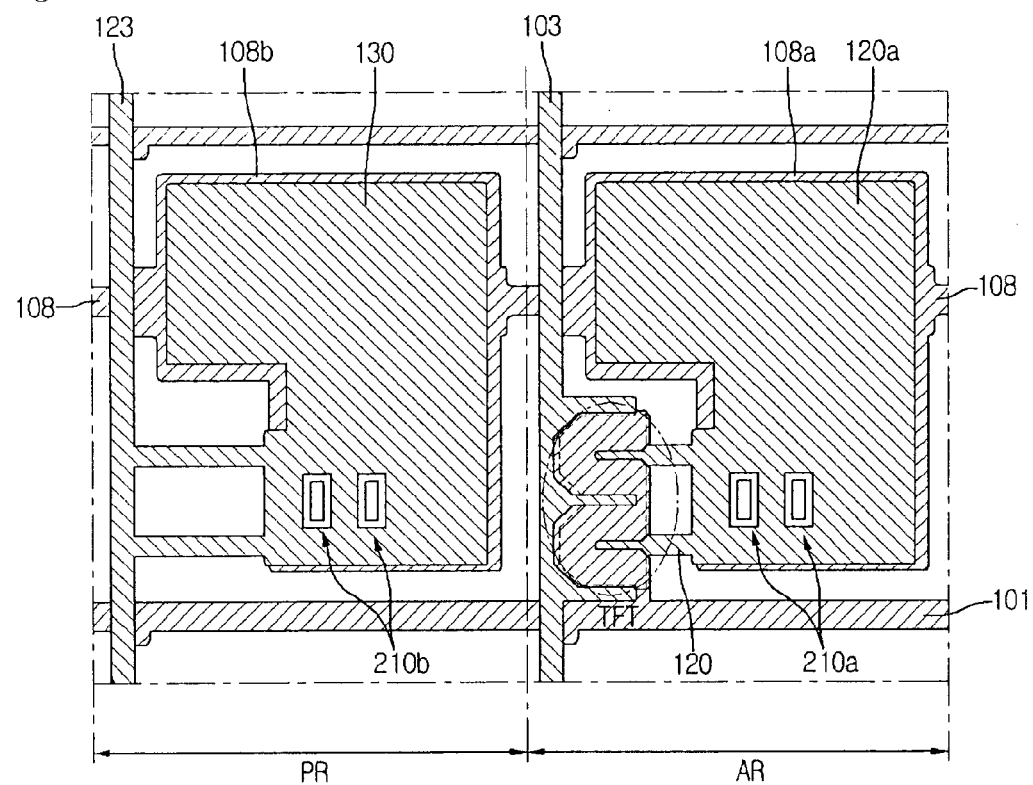

After the source and drain electrodes 119 and 120 and the data line 103 are formed on the substrate 200, a first passivation layer 140, a dielectric layer 141, and a second passivation layer 142 are sequentially formed on the entire region of the substrate 200 as illustrated in FIG. 4C, and a mask process is performed to form a first contact hole 210a and a second contact hole 210b in the storage electrode 120a and the dummy storage electrode 130. Here, the first passivation layer 140 and the second passivation layer 142 can include an inorganic material such as an oxide and a nitride, and an organic material.

The dielectric layer 141 may be an organic layer, or may alternatively be an inorganic layer or a photoresist.

Figure 4D:
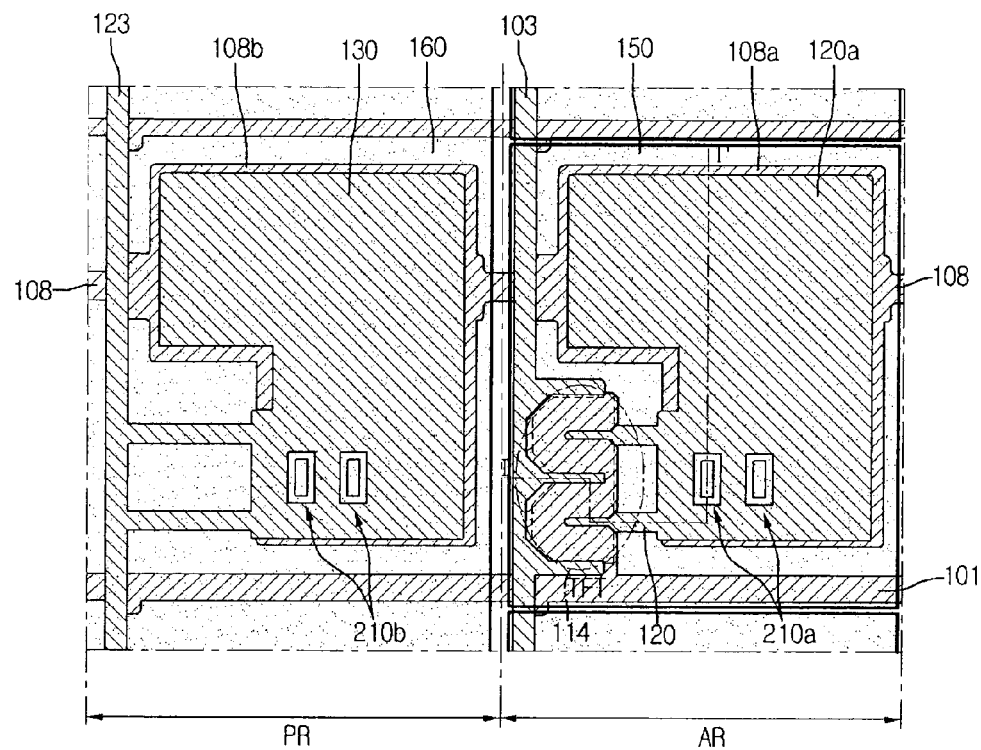

After the first and second contact holes 210a and 210b are formed as described above, a transparent and conductive material such as indium tin oxide (ITO), indium zinc oxide (IZO), or amorphous ITO (a-ITO) is formed on the entire surface of the substrate 200 as illustrated in FIG. 4D.

A mask process is performed to form a pixel electrode 150 in a pixel region of the active region, and form a dummy pixel electrode 160 in the peripheral region from the transparent conductive material.

At this point, the pixel electrode 150 extends to cover the data line 103 and the gate line 101 defining the pixel region, and a TFT.

The dummy pixel electrode 160 in the peripheral region is formed in an integral type electrode structure around the entire peripheral region. In operation, one of a black, gray, or white data signal is supplied to the peripheral region through the dummy data line 123 to reduce a defect during an assembling process of the flat display device and the case.

FIGS. 5A to 5D are views illustrating a method for manufacturing a flat display device according to still another embodiment of the invention. A manufacturing process region includes a TFT region of a pixel region, a storage capacitance region, the gate pad GP of FIG. 1A, and the data pad DP of FIG. 1A.

Figure 5A:
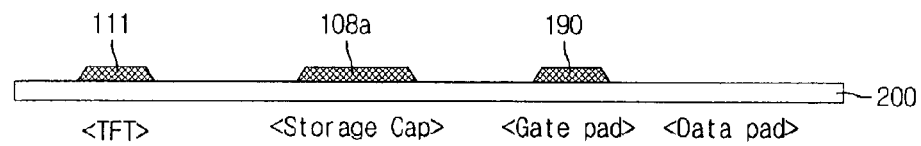
FIGS. 5A to 5D are views illustrating a method for manufacturing a flat display device according to another embodiment of the invention.

The manufacturing method of FIGS. 5A to 5D is described with reference to FIG. 2. After one of Cu, Cr, a Cr alloy, Mo, and an alloy thereof is formed on a substrate 200, a photoresist is patterned using a photolithography process including a mask. A wet etching process is performed using the patterned photoresist as a mask to form a gate electrode 111, a first common electrode 108a inside a pixel region, a gate line 101, a common line 108, and the gate pad 190 on the substrate 200 as illustrated in FIG. 5A. The gate pad 190 extends from the gate line 101 to the pad region of FIG. 1.

Figure 5B:
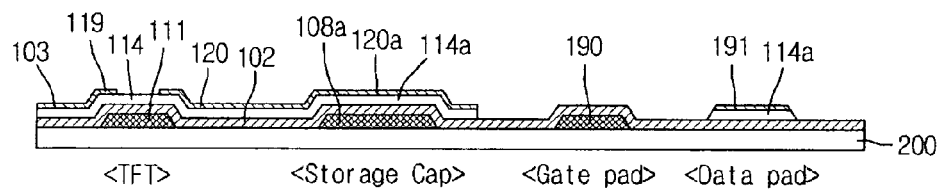

After the gate electrode 111 is formed on the substrate 200, a gate insulating layer 102 is formed on the entire region of the substrate 200 as illustrated in FIG. 5B. The gate insulating layer 102 can be a SiOx layer or a SiNx layer.

Subsequently, an amorphous silicon layer, a doped (n+, p+) amorphous silicon layer, and a metal layer are sequentially formed on the gate insulating layer 102. A pattering operation is performed using a photolithography method including a diffraction mask or a half-tone mask, and a wet etching process and a dry etching process are repeatedly performed to form a channel layer 114, source and drain electrodes 119 and 120, and a data line 103 on the gate electrode 111 of the TFT. A storage electrode 120a integrally formed with the drain electrode 120 and extending from a pixel region is formed in the storage capacitance region.

At this point, the data pad 191 exists in the data pad region, and a semiconductor layer 114a exists between the data pad 191 and the gate insulating layer 102.

Figure 5C:
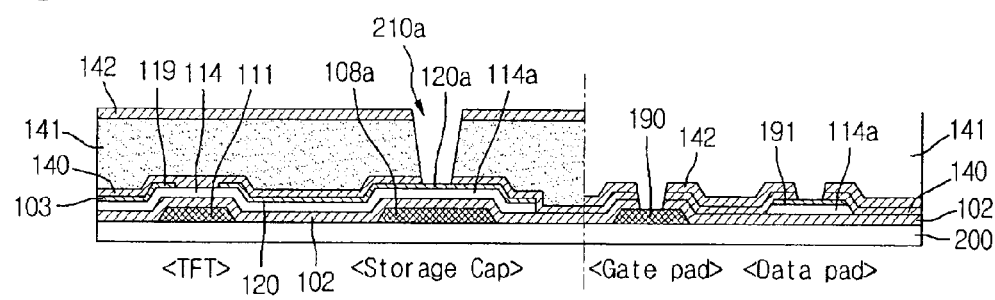

After the source and drain electrodes 119 and 120 and the data line 103 are formed on the substrate 200 as described above, a first passivation layer 140, a dielectric layer 141, and a second passivation layer 142 are sequentially formed on the substrate 200 as illustrated in FIG. 5C. A first contact hole 210a is formed in the storage electrode 120a using a photolithography method including a mask. At this point, portions of the dielectric layer 141 corresponding to the gate pad region and the data pad region are removed, so that the first passivation layer 140 and the second passivation layer 142 are stacked on the gate insulating layer 102. Here, the gate pad 190 and the data pad 191 are exposed through a first contact hole process. More particularly, the first passivation layer 140 is formed on the entire surface of the substrate 200, and then the dielectric layer 141 is stacked on the entire surface of the substrate 200. The process of forming the first contact hole in the dielectric layer 141 is then performed and a portion of the dielectric layer 141 corresponding to the pad region is removed completely. After that, the second passivation layer 142 is formed on the substrate 200, and then the first contact hole process is performed.

The first and second passivation layers 140 and 142 can include an inorganic material such as an oxide and a nitride, or an organic material. The dielectric layer 141 may be an organic layer, or alternatively can be an inorganic layer or a photoresist.

Figure 5D:
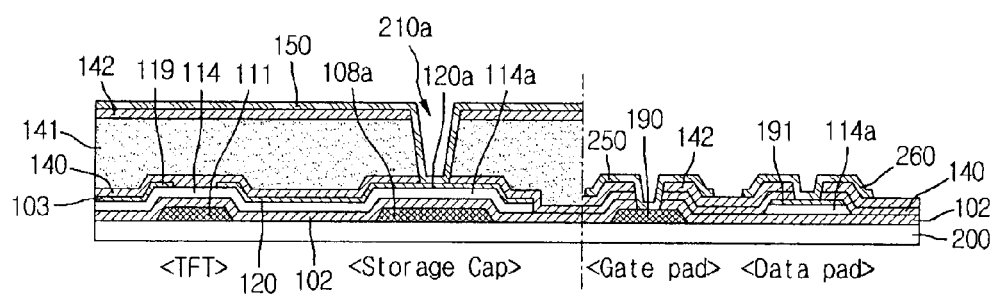

After the first contact holes 210a is formed as described above, one of transparent and conductive indium tin oxide (ITO), indium zinc oxide (IZO), and amorphous ITO (a-ITO) is formed on the entire surface of the substrate 200 as illustrated in FIG. 5D.

A mask process is then performed to form a pixel electrode 150 in a pixel region of an active region, a gate electrode 250 on the gate pad 190, and a data pad electrode 260 on the data pad 191.

At this point, the pixel electrode 150 extends to cover the data line 103 and the gate line 101 defining the pixel region and a TFT (refer to FIG. 2).

Referring to FIG. 2, the dummy pixel electrode 160 in a peripheral region is formed in an integral type electrode structure around the entire peripheral region. In operation a black, gray, or white data signal is supplied to the peripheral region through the dummy data line 123 to reduce a defect during an assembling process of the flat display device and the case.

FIG. 6 is a plan view of a flat display device according to still another embodiment of the invention.

Since the elements in FIG. 6 using the same reference numerals as those of FIG. 2 denote the same elements, descriptions thereof are omitted.

Referring to FIG. 6, a TFT having a pixel structure of a flat display device according to still another embodiment of the invention includes two gate electrodes of a first gate electrode 211a and a second gate electrode 211b.

The TFT includes a source electrode 219 branching off from the data line 103, a connection electrode 218 disposed between the first gate electrode 211a and the second gate electrode 211b, and a drain electrode 220 partially overlapping the second gate electrode 211b and connected with a storage electrode 220a in the pixel region.

The storage electrode 220a is integrally formed with the drain electrode 220. A common electrode 108a is disposed in the lower portion, and a pixel electrode 150 is disposed on the storage electrode 220a. The pixel electrode 150 extends to cover a data line 103 and a gate line 101 defining a pixel region. Since the function and effect of the pixel electrode 150 are the same as those described in FIG. 2, descriptions thereof are omitted.

When a driving signal is supplied through the gate line 101, driving voltages are supplied to the first and second gate electrodes 211a and 211b of the TFT to turn on the TFT. A data signal supplied through the data line 103 sequentially passes through the source electrode 219, the connection electrode 218, the drain electrode 220, and the storage electrode 220a to be supplied to the pixel electrode 150.

When the data signal is supplied to the pixel electrode 150 as described above, an electric field is formed between the pixel electrode 150 and a second common electrode 170b formed on an ink layer 170a to operate charged particles contained in microcapsules of the ink layer 170a as described above with reference to FIGS. 2 and 3.

The TFT having the above-described structure can operate with a high driving voltage to improve an operating characteristic of the TFT and the display.

As described above, the flat display device according to the present disclosure extends the pixel electrode disposed in each pixel region, allows the pixel electrode to cover both the data line and the gate line disposed in the pixel region to secure the desired capacitance in each pixel region, and increases reflectivity to improve image quality.

In addition, a pixel electrode is provided in the peripheral region of the flat display device to reduce a defect during an assembling process of the flat display device and the case.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A flat display device comprising:
a substrate divided into an active region for displaying an image and a peripheral region that does not display the image and around the active region;
a gate line that crosses a data line to define a pixel region in the active region;
a thin film transistor in a region near a crossing of the gate line and the data line;
a first common electrode in the pixel region;
a storage electrode on the first common electrode to provide storage capacitance;
a pixel electrode electrically connected with the storage electrode and overlapping the pixel region, the data line, and the gate line; and
an ink film covering the active region and the peripheral region, the ink film including microcapsules including charged particles,
wherein the peripheral region includes:
a plurality of dummy pixel regions in the peripheral region, each defined by crossings of a gate line and a dummy data line, wherein each dummy pixel region includes:
a dummy common electrode in the dummy pixel region;
a dummy storage electrode overlapping the dummy common electrode and branched directly from the dummy data line; and
a dummy pixel electrode electrically contacting the dummy storage electrode,
wherein the dummy pixel electrode is integrally formed with each other in all of the dummy pixel regions of the peripheral region.

2. The flat display device according to claim 1, further comprising a dielectric layer between the pixel electrode and the storage electrode.

3. The flat display device according to claim 2, wherein a first passivation layer and a second passivation layer are on and under the dielectric layer, respectively.

4. The flat display device according to claim 2, wherein the dielectric layer includes an organic material.

5. The flat display device according to claim 1, wherein the pixel electrode extends to cover the gate line, the data line and the thin film transistor in the pixel region.

6. The flat display device according to claim 1, wherein the ink film further includes a second common electrode on the microcapsules.

7. The flat display device according to claim 1, wherein a source electrode of the thin film transistor includes three source electrode sections, and a drain electrode of the thin film transistor includes two drain electrode sections, and wherein the drain electrode sections are alternated with the source electrode sections.

8. The flat display device according to claim 7, wherein channel layers of the thin film transistor are between the three source electrode sections of the source electrode and the two drain electrodes sections of the drain electrode.

9. The flat display device according to claim 1, further comprising a common line parallel to the gate line and crossing the pixel region.

10. The flat display device according to claim 9, wherein the common line has a narrower width in a region between pixel regions in which the common line crosses the data line than a width of the common line in the pixel region.

11. The flat display device according to claim 1, wherein the first common electrode is branched from the common line toward the adjacent gate lines.

12. The flat display device according to claim 1, wherein the storage electrode is dispose on an entire area of the pixel region except for the thin film transistor.

13. The flat display device according to claim 12, wherein the first common electrode face-to-face overlaps the storage electrode.

14. The flat display device according to claim 1, wherein the dummy pixel region has no thin film transistor.

15. The flat display device according to claim 1, wherein the dummy pixel electrode is disposed around an entire area of the peripheral region around the active region.

16. The flat display device according to claim 1, wherein the dummy pixel electrode is electrically connected with each other in all of the dummy pixel regions of the peripheral region.

* * * * *